United States Patent [19]

Mitsuhashi et al.

[11] Patent Number: 5,093,706
[45] Date of Patent: Mar. 3, 1992

[54] SEMICONDUCTOR DEVICE HAVING MULTIPLE LAYER RESISTANCE LAYER STRUCTURE AND MANUFACTURING METHOD THEREFOR

[75] Inventors: Junichi Mitsuhashi; Shinichi Satoh; Hideki Genjyo; Yoshio Kohno, all of Hyogo, Japan

[73] Assignee: Mitsubishi Denki Kabushiki Kaisha, Tokyo, Japan

[21] Appl. No.: 377,998

[22] Filed: Jul. 11, 1989

[30] Foreign Application Priority Data

Jul. 19, 1988 [JP] Japan .................. 63-179887

[51] Int. Cl.$^5$ ............................................. H01L 27/02
[52] U.S. Cl. .................................. 357/41; 357/4; 357/6; 357/51; 357/54
[58] Field of Search .............. 357/6, 51, 54, 54 A, 357/59 F, 23.6 G, 23.1, 41, 4; 365/148, 182

[56] References Cited

U.S. PATENT DOCUMENTS

| | | | |
|---|---|---|---|
| 4,131,902 | 12/1978 | Kub | 357/6 |
| 4,406,051 | 9/1983 | Iizuka . | |
| 4,641,173 | 2/1987 | Malhi et al. | 357/6 |
| 4,702,937 | 10/1987 | Yamoto et al. | 357/51 |
| 4,711,699 | 12/1987 | Amano | 357/54 |
| 4,755,480 | 7/1988 | Yau et al. . | |
| 4,786,612 | 11/1988 | Yau et al. | 357/51 |
| 4,823,181 | 4/1989 | Mohsen et al. | 357/51 |
| 4,888,820 | 12/1989 | Chen et al. | 357/23.6 G |
| 4,931,897 | 6/1990 | Tsukamoto et al. | 357/51 |

FOREIGN PATENT DOCUMENTS

| | | |
|---|---|---|
| 3702409 | 6/1987 | Fed. Rep. of Germany . |
| 61-88548 | 5/1986 | Japan .................. 357/6 |
| 62-195179 | 8/1987 | Japan . |

OTHER PUBLICATIONS

Frohman-Bentchkowsky et al., "Charge Transport and Storage in Metal-Nitride-Oxide-Silicon (MNOS) Structures," Jul., 1969, *Journal of Applied Physics*, vol. 40, No. 8, pp. 3307-3319.

*Primary Examiner*—Andrew J. James
*Assistant Examiner*—Courtney A. Bowers
*Attorney, Agent, or Firm*—Lowe, Price, LeBlanc & Becker

[57] ABSTRACT

A high load resistance type static random access memory (SRAM) is provided, as an example of a semiconductor device having a high resistance layer. The SRAM includes a semiconductor substrate (1) of a first conductivity type with an impurity diffusion region (3) of second conductivity type selectively formed thereon. An aluminum interconnection layer (8) is formed over the impurity diffusion region (3). Provided between the aluminum interconnection layer (8) and the impurity diffusion region (3) is a double-layer high resistance structure which comprises a nitride layer (63a) formed adjacent the semiconductor substrate (1) and an oxide layer (63b) adjacent the aluminum interconnection layer (8). The impurity diffusion region (3) forms part of a MOS field effect transistor, which is coupled to the high resistance layer (63) to form a flip-flop memory cell. The double-layer high resistance structure makes it possible to adjust the resistance at a desired particular high value by controlling the thickness of the layer. The structure permits a high degree of integration of the SRAM. The high resistance layer is not affected by diffusion or penetration of the impurity thereto.

18 Claims, 17 Drawing Sheets

▨ : ACTIVE REGION

⌐¬ : GATE REGION

- □ : POLYSILICON LAYER
- ▨ : HIGH RESISTANCE REGION
- ⊠ : CONTACT

- ⊡ : ALUMINUM INTERCONNECTION

SEMICONDUCTOR DEVICE HAVING MULTIPLE LAYER RESISTANCE LAYER STRUCTURE AND MANUFACTURING METHOD THEREFOR

BACKGROUND OF THE INVENTION

1. Field of the Invention

This invention relates generally to high resistance layers for semiconductors and to methods of manufacturing such layers. The invention has particular utility within the field of high resistance load resistors in static random access memories (SRAMs).

2. Description of the Background Art

This invention produces the most desirable results when applied to the static random access memory, and the following description is directed to the static random access memory.

The static random access memory is well known in the art. There is illustrated in FIG. 11A, an overall arrangement of a conventional 8K word×8 bit static random access memory (hereinafter referred to as SRAM). FIG. 11B schematically shows the flow of data in the SRAM of FIG. 11A.

Referring to FIG. 11A, the SRAM includes a memory cell array 41 composed of a plurality of memory cell 40, which constitutes a data storage section. The SRAM also includes an X decoder 42 and a Y decoder 43 coupled to an X address buffer and a Y address buffer, respectively; and an input-output interface section having sense amplifiers connected to output buffers. The plurality of memory cells 40 are arranged at the intersections between the word lines connected to the X decoder 42 and the bit lines connected to the Y decoder, thereby forming the memory cell array 41. In response to externally applied row and column address signals, the X decoder 42 and the Y decoder 43 selects a word line and a bit line, respectively, and a particular memory cell 40 at the intersection between the selected word line and bit line is addressed.

Most specifically, in the address buffer a normal signal X and an inverted signal $\overline{X}$ are generated in response to the address signal applied thereto. Upon receipt of the signals X and $\overline{X}$, the X decoder 42 selects one row of 256 rows of memory cells and charges the word lines coupled to the memory cells in the selected rows to a high level while discharging the remaining word lines to a low level. As a result, the memory cells 40 in the selected row are activated and the data stored in the activated memory cells are supplied to the pairs of bit line and $\overline{\text{bit line}}$. Of the 32 bit line pairs in each channel, one bit line pair is coupled to the pair of I/O line and $\overline{\text{I/O}}$ line through a multiplexer. The selection in the multiplexer is performed by the Y decoder 43. In this way, the desired 8 bits of memory cells are connected to the I/O line.

In writing data, input data are written into the selected memory cells 40. In reading out data, the data stored in the selected memory cells are sensed and supplied out as the output data by the sense amplifier.

The data writing and reading operations are now described with reference to FIG. 11B. The sense amplifier and a write driver are connected to be I/O line. The data are transferred in the direction of a solid arrow during the read-out operation, while the data are transferred in the direction of a dotted arrow during the writing operation. The write enable or WE signal and the output enable or OE signal, which function like the valves for the controlling the flow of data, regulate the outputs of the word driver and the output buffer, respectively, at a high impedance.

In FIG. 12, there is shown an equivalent circuit for one memory cell 40 in the SRAM of FIG. 11A. The memory cell 40 includes a flip-flop which comprises a pair of driver transistors T1 and T2, (suitably N channel MOSFETs) and pair of load resistors 6 of high resistance value. As shown, the driver transistors T1 and T2 have the gate and drain electrodes cross-coupled, and the load resistors 6 are connected to the drain electrodes of the transistors T1 and T2. Also, connected to the drain electrodes of the transistors T1 an T2 are access transistors T3 and T4 (preferably MOSFETs). The access transistors T3 and T4 have the gate electrodes coupled to the word lines 33. As the word line 33 is selected, the data held in the driver transistors T1 and T2 are transferred to the bit line 31 and $\overline{\text{bit line}}$ 32 through the access transistors T3 and T4.

In operation, when the data stored in the memory cell 40 is to be read out, the word line 33 is activated by the application of a predetermined voltage. As the word lines 33 is activated, it causes voltages corresponding to the present states of the driver transistors T1 and T2 to appear on the bit line 31 and the $\overline{\text{bit line}}$ 32 via the access transistors T3 and T4. When data to be written into the memory cell, the word line 33 is activated by the application of a predetermined voltage. Under the activated conditions, the bit line 31 and $\overline{\text{bit line}}$ 32 are applied with the desired potentials corresponding to the logic state to be written.

Most specifically, when the access transistors T3 and T4 are turned on by the word line 33, the data signals on the bit line 31 and the $\overline{\text{bit line}}$ 32 are latched into the flip-flop composed of the driver transistors T1 and T2. In order to maintain the latched data signal, it is necessary to keep supplying electric current to the flip-flop from a power supply Vcc through the high load resistors 6. In addition, the current supply should preferably be at a possible minimum to keep down the power consumption during the stand-by. However, for the purpose of maintaining the stored data, the supply current must exceed the leakage current of the transistors while being turned off.

Now, the process for manufacturing the conventional memory cell of FIG. 12 is now described with reference to FIGS. 13A-13E which show pattern layouts for the memory cell in successive stages of manufacture.

In FIG. 13A, an oxide isolation layer 2 is selectively formed on the major surface of a P-type silicon substrate 1 to define and isolate active regions 30 yet to be formed.

In FIG. 13B, there are formed gate electrodes 21 and 22, and a word line 33 over the active regions 30 at predetermined positions. And, using the gate electrodes 21 and 22, and the word line 33 as masks, N-type impurity ions are implanted into the active regions 30 to create N+ diffusion region 3.

In the next step, as shown in FIGS. 13C, a low-resistance polysilicon layer 5 is deposited. The polysilicon layer 5 has a contact 9a between the gate electrode 21 and the N+ diffusion region 3, a contact 9b to the N+ diffusion region 3, and a contact 9c between the gate electrode 22 and the N+ diffusion layers 3. The low-resistance polysilicon layer 5 also includes a high-resistance polysilicon regions 61 and 62 disposed above the gate electrode 21 and 22.

In FIG. 13D, an aluminum interconnection 8 is formed on the low resistance layer 5 and is connected to the layer 5 through a contact 9d formed therein.

Finally as shown in FIG. 13E, contacts 9f and 9e are made in N+ diffusion regions forming the access transistors T3 and T4. An aluminum interconnection is provided and connect the bit line 31 and $\overline{\text{bit line}}$ 32 through the contacts 9f and 9e, thereby to complete one memory cell.

FIG. 14 shows a partial cross-section of the memory cell taken along the line XIII—XIII of FIG. 13D. Referring now to FIG. 14, fabrication of the high load resistor 6 provided to retain the data latched in the flip-flop composed of the driver transistors T1 and T2 is explained.

As already discussed in connection to FIG. 13C, the high-resistance regions 61 and 62 comprise a high-resistance polysilicon layer. It is noted that the high resistance polysilicon regions normally have a resistance value in the order of several TΩ. An oxide isolation layer 2 is first deposited on the P-type silicon substrate 1. The gate electrodes of access transistors T3 and T4, and driver transistors T1 and T2 which are shown and represented by a word line 33 in the drawing figure then formed on the silicon substrate with a gate oxide layer 4 interposed between the word lines 33 and the substrate 1. Subsequently, N-type impurity ions such as phosphorous ions and arsenic ions are implanted into the P-type silicon substrate 1 to provide N+ diffusion regions 3.

Thereafter, undoped polysilicon is deposited and electrically connected to the N+ diffusion regions 3 by means of direct contact technique. The deposited polysilicon is doped twice with phosphorous ions of different doses thereby to form a low-resistance polysilicon layer 5 and a high-resistance polysilicon layer 61. In other words, the amount of implanted ions in the high resistance polysilicon layer 61 is smaller than that in the low resistance polysilicon layer 5. The large quantity of ions implanted in the low resistance polysilicon layer 5 are diffused into the P-type silicon substrate 1 by a later thermal treatment, creating a highly concentrated N+ diffusion regions 3.

Finally, an insulation layer 7 is formed, upon which an aluminum interconnection 8 is deposited to be in communication with the low resistance polysilicon layer 5 through the contact 9d. When it is intended to use the low resistance polysilicon layer 5 as the supply line Vcc, the aluminum interconnection can be dispensed with. The high resistance region is provided in this manner.

In FIG. 14, electric current supplied to the aluminum interconnection 8 serving as the power supply line Vcc flows through the low resistance polysilicon layer 5 and the high resistance polysilicon layer 61, and through the direct contact to N+ diffusion regions 3. The current flows continuous to the ground through the channel regions of the conducting driver transistors T1 and T2.

The conventional SRAM of high load resistance type incorporates the load resistor formed in the manner as described above. The load resistor shows a maximum resistance value depending upon the phosphorous ion implantation and has a sheet resistance in the order of several hundred MΩ□. In order to attain a sufficiently high resistance value, the polysilicon layer should have a greatest possible length-to-width ratio. However, this is definitely an impeding factor working against a greater component density and miniaturization of the SRAM.

Also, because the load resistor is made of the polysilicon layer and is communicated with the direct contact region to the impurity diffusion region, there is always a possibility that impurities diffuse from the silicon substrate into the polysilicon load resistor and/or hydrogen atoms penetrate into the polysilicon during manufacturing process, substantially decreasing the resistance value of the high resistance polysilicon layer.

A passivation layer is formed over the top layer of active layers on the semiconductor substrate as a surface protection against environment of using for a long time. The passivation layer is made of plasma silicon nitride (P-SiN). The plasma silicon nitride contains many hydrogen atoms. Thus, the hydrogen atoms penetrate into the polysilicon layer during both the manufacturing process of passivation layer and a long time for using semiconductor devices. The penetration of hydrogen atoms decreases the resistance value of the high resistance polysilicon layer.

Silicon oxide and/or silicon nitride layers for isolation between active layers are formed over the polysilicon layer under the passivation layer. The isolation layers are formed by using $SiH_4$ or $SiH_2Cl_2$ as material gas of chemical vapor deposition (CVD). For example, hydrogen gas is produced in the manufacturing process of silicon oxide and/or silicon nitride layers as shown in the following reaction formula.

$$SiH_4 + O_2 \rightarrow SiO_2 + 2H_2$$

$$3SiH_4 + 4NH_3 \rightarrow Si_3N_4 + 12H_2$$

The generated hydrogen gas penetrates into the polysilicon layer. Therefore, the penetration of hydrogen atoms decreases the resistance value of the high resistance polysilicon layer.

In an attempt to provide a smaller SRAM of high load resistance type, it has been proposed to use a load resistor made of an insulating material in Japanese Patent Laying-Open No. 62-195170. A semiconductor device incorporating such load resistor is illustrated in partial cross-section in FIG. 15.

As shown, an electric current path which comprises an N+ impurity diffusion regions 3 and an aluminum interconnection 8 is provided vertically with respect to the major surface of the P-type silicon substrate 1. Inserted in the electrical path is a load resistor in the form of an insulating oxide layer 65 of transition metal such as $Fe_2O_3$, NiO, CoO, $TiO_2$. A silicon oxide layer 71 and an intervening insulating layer 7 are provided between the metal oxide layer 65 and the P-type silicon substrate 1. The silicon oxide layer 71 is made by thermal oxidation and the intervening insulation layer 7 is made by CVD process.

As stated above, the oxide layer of the transition metal has been employed as the high resistance load resistor in the prior art. However, the oxide layer of the transition metal tends to contaminate the semiconductor substrate during manufacturing of the semiconductor device. In addition, since the conventional load resistor comprises a single oxide layer, the leakage current at the junction in the semiconductor substrate increases, resulting in a greater powerful consumption during the standby. The reason is based on the mechanical stress which locally remains in the oxide layer of the transition metal. The oxide layer of the transition metal may have residual mechanical stress inside the layer caused by the difference between the thermal expansion coefficient of the oxide layer of the transition metal and that of the silicon substrate in the manufacturing process. The mechanical stress may have an influence on the N+ impurity diffusion regions. The influence causes the increase of the leakage current at the junction in the semiconductor substrate. The single oxide layer construction of the load resistor makes it difficult to control each resistance at a desired value.

SUMMARY OF THE INVENTION

It is, therefore, an object of the invention to provide a semiconductor device having a high resistance layer whose resistance is readily controlled to a desired particular high value.

Another object of the invention is to provide a semiconductor device having a high resistance layer which exhibits a high resistance and occupies minimum amount of surface area on a semiconductor substrate.

Another object of the invention is to provide a semiconductor device having a stable, high resistance layer having a resistance that is not adversely affected by diffusion or penetration of impurity thereto.

A further object of the invention is to provide a SRAM including load resistances having a high values of resistance, suitable for SRAM operation, and permits a high degree of integration thereof.

Still another object of the invention is to provide a method of manufacturing high resistance layers for semiconductor devices.

A further object of the invention is to provide a method of manufacturing high resistance load resistors for SRAM integrated circuit devices.

Briefly stated, a semiconductor device having a high resistance layer according to the invention includes a semiconductor substrate, a semiconductor region, a conductive layer and a high resistance layer. The semiconductor substrate is a first conductive type substrate and has a major surface. The semiconductor region is a second conductivity type region and provided on the major surface of the semiconductor substrate. The conductive layer is provided over the semiconductor region. The high resistance layer is provided between the conductive layer and semiconductor region, and it comprises an oxide layer and a nitride layer stacked each other.

According to a preferred embodiment of the invention, the high resistance layer is of double layered structure which comprises an oxide layer formed on the side of the semiconductor substrate, and a nitride layer formed on the side of the conductive layer. Alternatively, the high resistance layer comprises a nitride layer formed adjacent to the semiconductor substrate and an oxide layer formed adjacent to the conductive layer. Most preferably, the high resistance layer is of triple layered structure which comprises a pair of oxide layers and a nitride layers sandwiched between them. The oxide layer may comprise a silicon oxide layer, and a nitride layer may comprise a silicon nitride layer. The conductive layer may comprise a polysilicon layer formed on the high resistance layer.

According to a preferred embodiment of the invention, a semiconductor device having a high resistance layer includes a static random access memory. Field effect transistors formed partially by the high resistance layer and a semiconductor region comprises a memory cell of the flip-flop type.

In a method for manufacturing the semiconductor device having a high resistance layer according to the invention, a semiconductor substrate of the first conductivity type is prepared. A semiconductor region of the second conductivity type is provided on the major surface of the semiconductor substrate. Formed on the semiconductor region is a high resistance layer which comprises stacked oxide layer and nitride layer. A conductive layer is positioned on the high resistance layer.

As the current is applied to the high resistance structure of the oxide and nitride layers stacked between the conductive layer and the semiconductor region, a small tunnel current flows in the combined nitride-oxide layer. The current is hard to flow through the oxide layer, while it is relatively easier for the current to flow through the nitride layer than in the oxide layer. Accordingly, the resistance value of the high resistance layer composed of the nitride and oxide layers can be readily controlled by adjusting the thickness of the oxide and nitride layers. Besides, the oxide and nitride layers for the high resistance layer are made of an oxide and nitride of silicon which is used to form the semiconductor substrate. This is advantageous in that each of oxide and nitride layers does not contaminate the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to FIGS. 1A-1E, there are illustrated pattern layouts, at successive stages of manufacture, for one memory cell in a semiconductor device having a high resistance layer embodied as an SRAM of high load resistance type according to the invention.

Figure 1A:
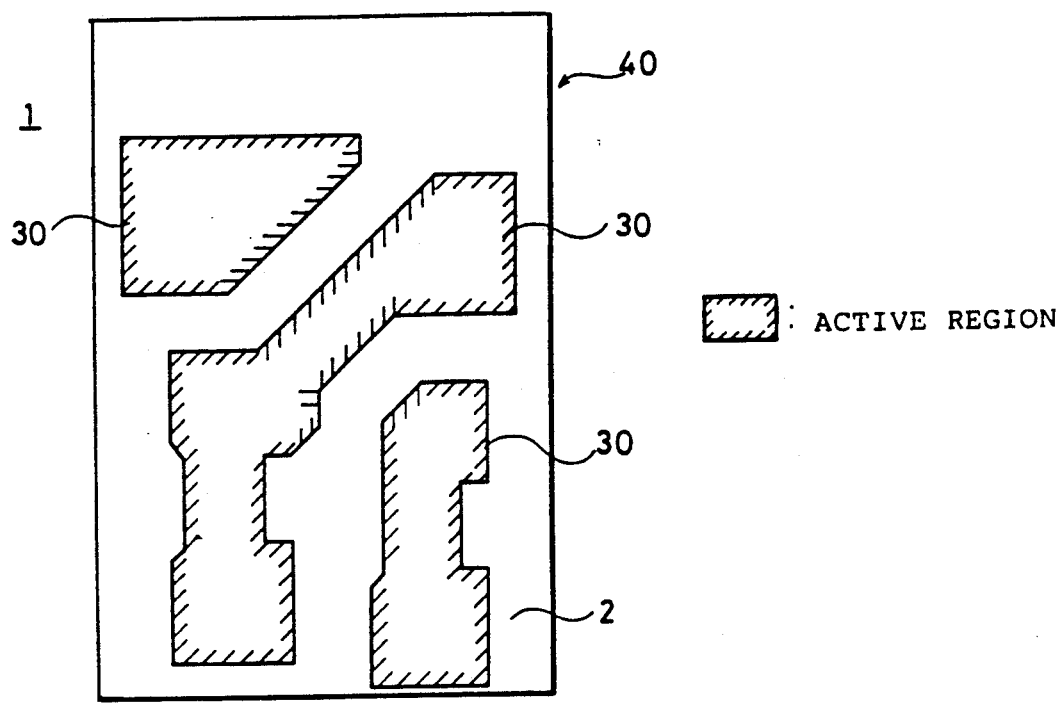
FIGS. 1A-1E are partial plan views showing pattern layouts for a memory cell in an SRAM having a high resistance layer according to the invention at successive stages of manufacture.

In FIG. 1A, an isolation oxide layer 2 is selectively formed in a desired pattern on the major surface of a P-type silicon substrate 1 by means of thermal oxidation technique in order to define and isolate active regions 30 yet to be formed.

Figure 1B:
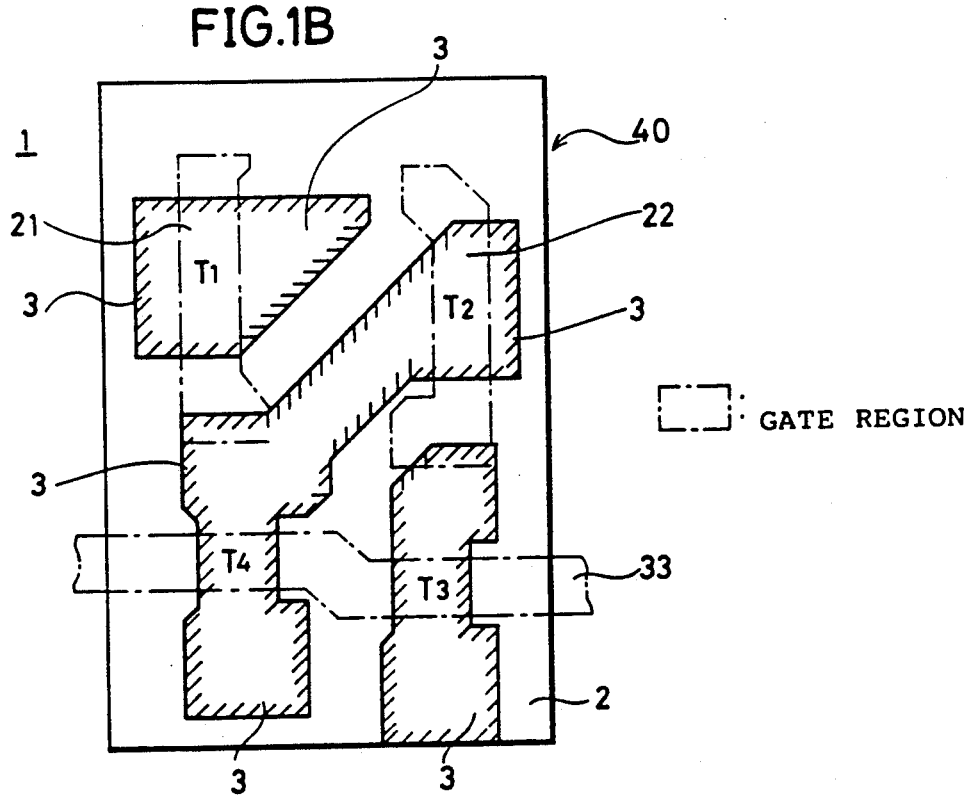

As shown in FIG. 1B, gate electrodes 21 and 22 and word line 33 are formed of polysilicon over the predetermined areas of the active region 30. Then, using the gate electrodes 21 and 22 and the word line 33 as the masks, N-type impurity ions such as phosphorus ions and arsenic ions are implanted into the P-type silicon substrate 1 thereby to create N+ diffusion regions 3 in the active regions 30.

Figure 1C:
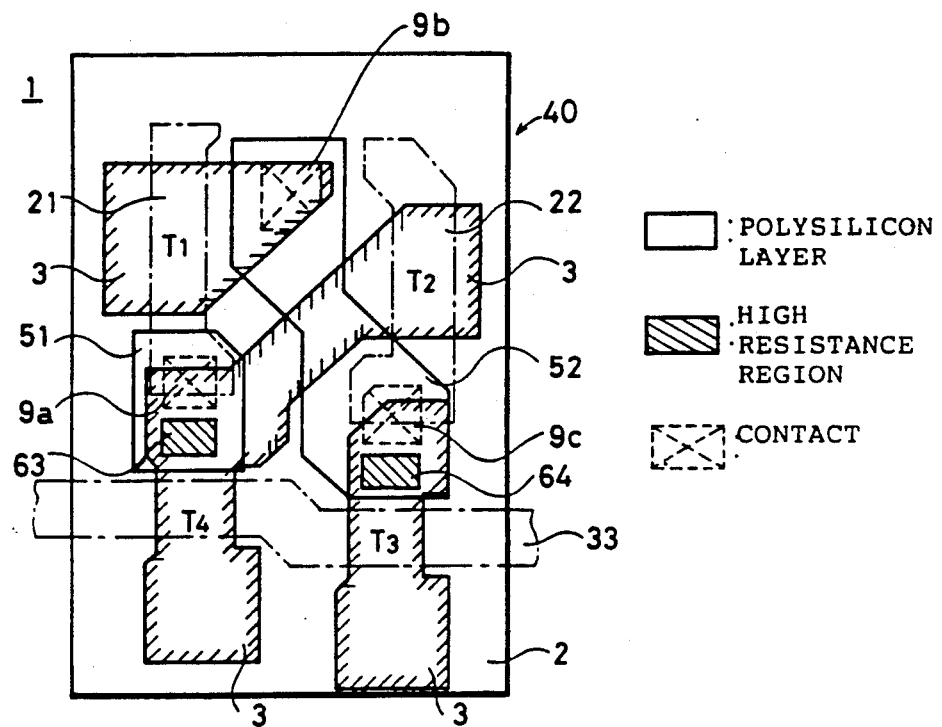

In FIG. 1C, high resistance regions 63 and 64 which comprise stacked oxide and nitride layers are deposited over the N+ diffusion regions 3 in a desired pattern and in direct contact therewith. Low resistance polysilicon layers 51 and 52 are formed on the high resistance regions 63 and 64 and have contact portions in contact with the high resistance regions 63 and 64. The low resistance polysilicon layers 51 and 52 have a contact 9a between the gate electrode 21 and the N+ diffusion region 3, a contact 9b to the N+ diffusion region 3, and a contact 9c between the gate electrode 22 and the N+ diffusion region 3.

Figure 1D:
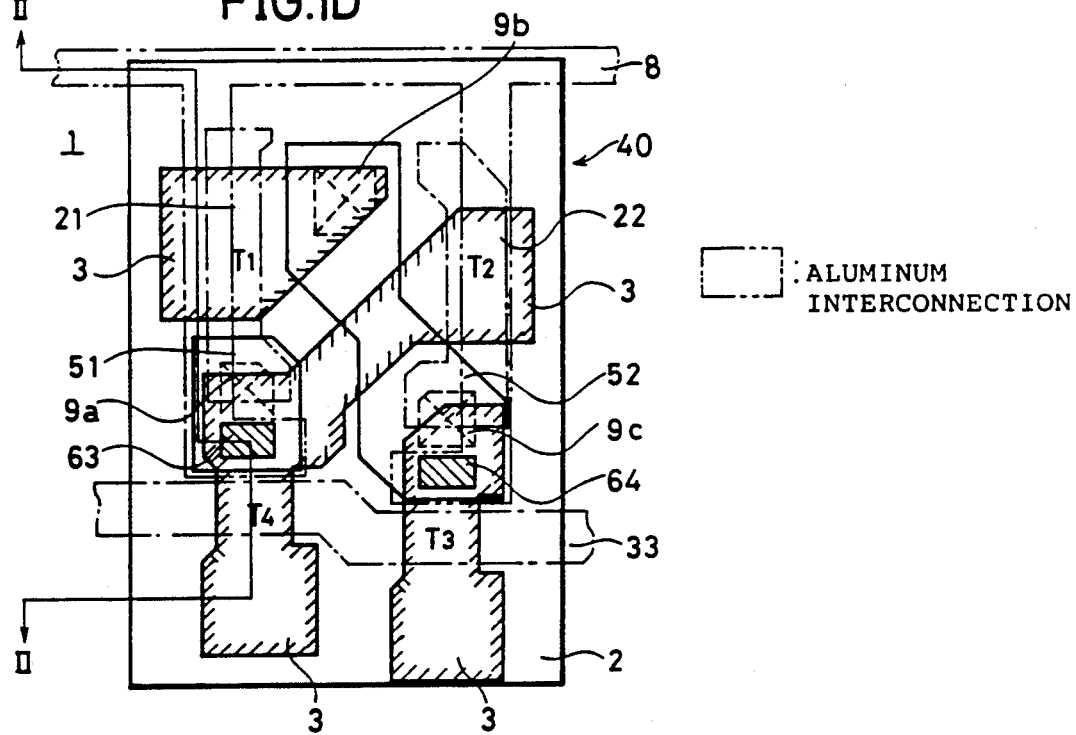

Thereafter as shown in FIG. 1D, an aluminum interconnection 8 which serves as the supply line Vcc is provided to connect the low resistance polysilicon layers 51 and 52.

Figure 1E:
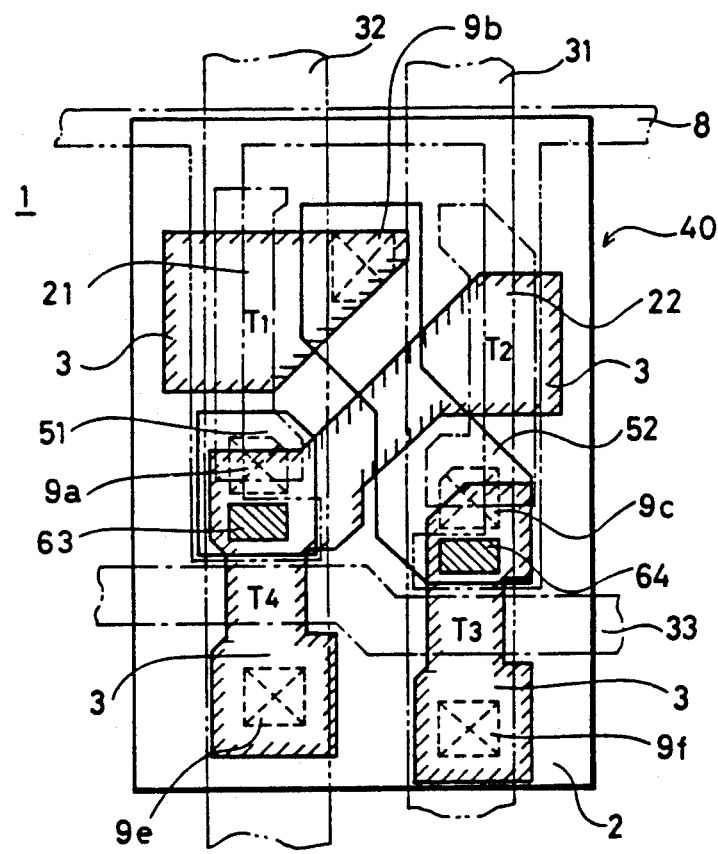

Finally as shown in FIG. 1E, bit line 31 and $\overline{\text{bit line}}$ 32 are formed of aluminum in communication with the N+ diffusion region 3 constituting the access transistors T3 and T4 through their respective contacts to 9f and 9e. This finishes one memory cell 40 of the high load resistance type SRAM.

Referring to FIGS. 2A-2G, the process for manufacturing the high load resistance type SRAM according to the invention is now described.

Figure 2A:
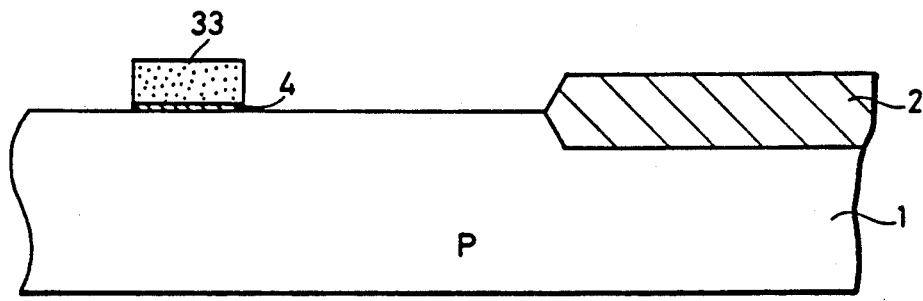
FIGS. 2A-2G are cross-sectional views of the memory cell taken along the line II—II of FIG. 1D at successive stages of one manufacturing process thereof.
Figure 2B:
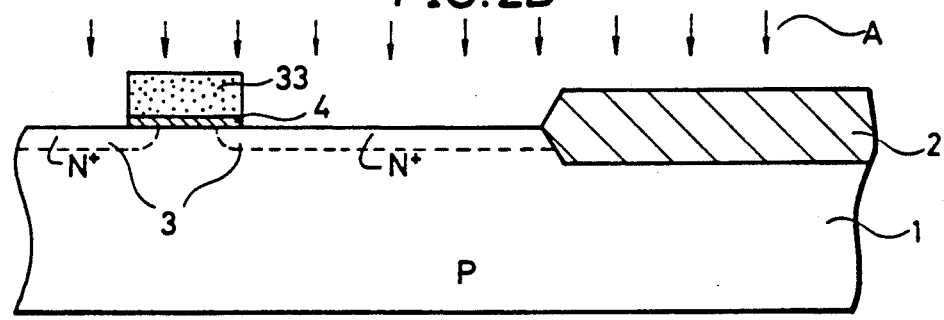

As shown in FIG. 2A, a thick isolation oxide layer 2 for device isolation is formed on a P-type silicon substrate 1 by means of local oxidation or LOCOS technique. Then, a gate oxide layer 4 is selectively deposited using thermal oxidation technique. The polysilicon layer is coated over the gate oxide layer 4 and patterned to form a word line 33 which comprises the gate of the access transistor. Thereafter, N-type impurities such as phosphorus ions and arsenic ions are implanted into the P-type silicon substrate 1 in the direction of the arrow A to produce an N+ diffusion region 3.

Figure 2C:
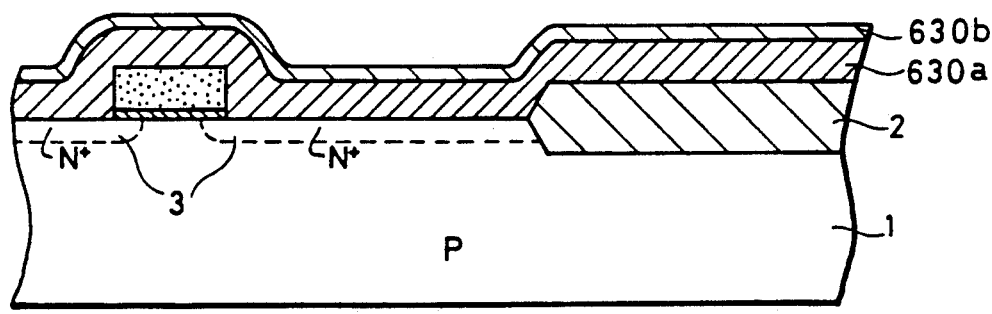
Figure 2D:
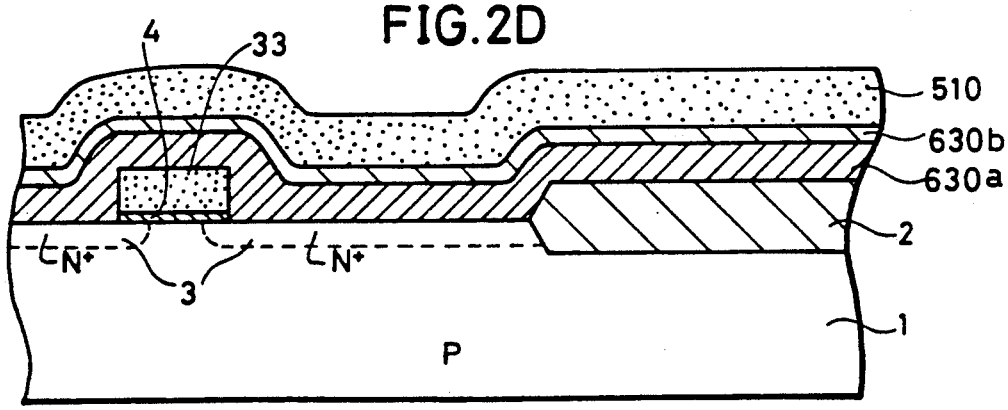

As shown in FIG. 2C, the silicon nitride layer 630a is deposited over the entire surface of the substrate by low pressure chemical vapor deposition or LPCVD, followed by thermal oxidation thereof at temperatures between 850°-950° C. This thermal oxidation procedure leaves a silicon oxide layer 630b over the silicon nitride layer 630a. A low resistance polysilicon layer 510 is then deposited over the entire silicon oxide layer 630b by the LPCVD technique as shown in FIG. 2D.

Figure 2E:
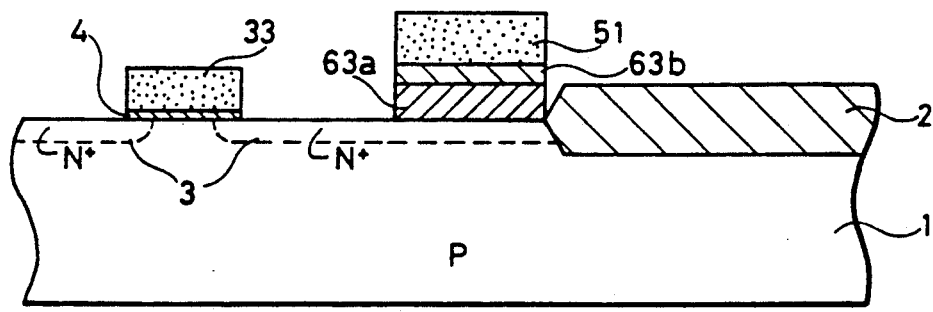
Figure 2F:
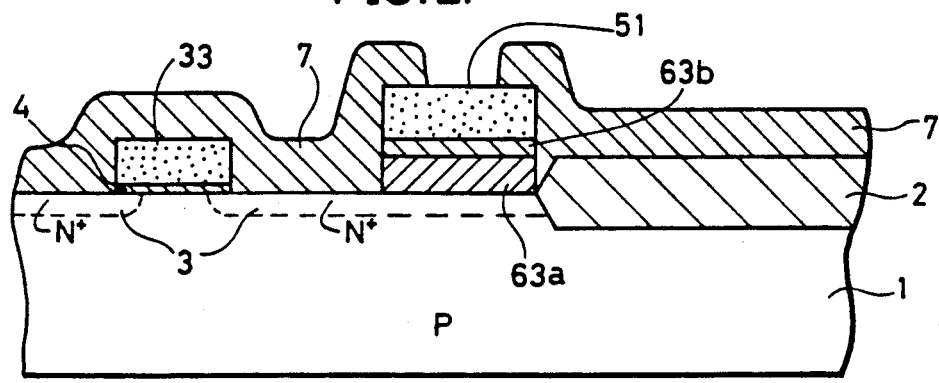

Referring next to FIG. 2E, after patterning of the low resistance polysilicon layer 510 to leave a low resistance polysilicon layer 51, the silicon nitride layer 630a and the silicon oxide layer 630b are etched using the low resistance polysilicon layer 51 as a mask, thereby forming a silicon nitride layer 63a and a silicon oxide layer 63b of the desired pattern which serves as the high resistance layer. As shown in FIG. 2F, an insulating layer 7 is deposited over the entire surface of the substrate. A hole is made in the insulating layer at a location over the low resistance polysilicon layer 51. An aluminum interconnection 8 is formed on the insulating layer for connection to the low resistance polysilicon layer 51 through the hole made in the insulating layer. A passivation layer covers the entire substrate in a finishing step.

The performance of the load resistance structure which comprises the combination of the silicon oxide layer 63b and the silicon nitride layer 63a is now described with reference to FIG. 2G. Current through the aluminum interconnection 8 serving as the supply line Vcc flows through the low resistance polysilicon layer 51 and through the load resistance structure formed of vertically arranged silicon oxide layer 63b and the silicon nitride layer 63a to the N+ impurity diffusion region 3. From the N+ diffusion region 3, the current flows to ground through the channel regions of the driver transistors. This current flow is effective to keep the data latched by the flip-flop composed of the driver transistors T1 and T2 in the SRAM. The double-layer high load resistance structure according to the invention allows a smaller amount of current to flow therethrough due to the tunnel current flowing the oxide layer and Poole-Frenkel current flowing the nitride layer.

In case of applying large electrical field in the oxide layer, carriers pass through the oxide layer by tunnel effect. The tunnel current is divided broadly into "Fowler-Nordheim tunnel current" and "Direct tunnel current", depending on the thickness of insulating layer such as silicon oxide layer. If large electrical field is applied in the oxide layer, the distance from the bottom of conduction energy band in silicon to the conduction energy band of the oxide layer becomes smaller, and tunnel current flows through energy barrier shaped like a triangle. This tunnel current is named "Fowler-Nordheim tunnel current". On the other hand, if the thickness of the oxide layer is smaller, the tunnel current flowing through the oxide layer is named "Direct tunnel current". In case of the thickness of silicon oxide layer smaller than 50 Å, direct tunnel current flows through the oxide layer. In case of the thickness of silicon oxide layer larger than 50 Å, Fowler-Nordheim tunnel current flows through the oxide layer.

Electrons trapped in insulating layers such as silicon nitride ($Si_3N_4$) layer are thermally excited to conduction energy band with the assistance of electrical field. In this case, current flowing through the insulating layer is named "Poole-Frenkel current".

Figure 3A:
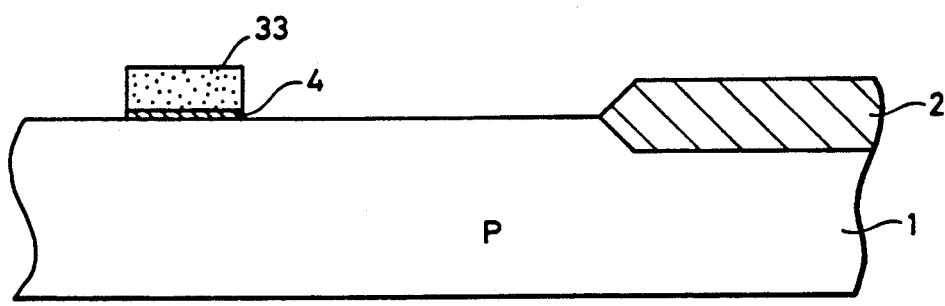
FIGS. 3A-3E are cross-sectional views of the memory cell taken along the line II—II of FIG. 1D at successive stages in another manufacturing process thereof.
Figure 3B:
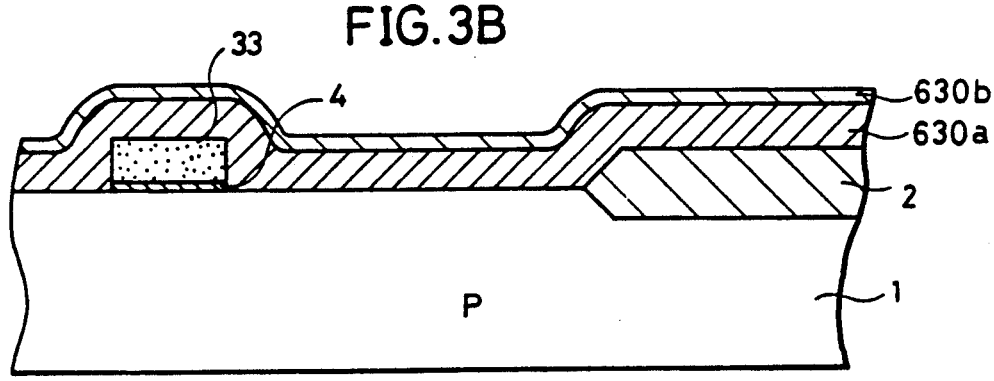

Another process for manufacturing the semiconductor device having a high resistance layer as embodied in a high load resistance type SRAM is described with reference to FIGS. 3A-3E. In FIG. 3A, there are formed an insulating oxide layer 2, a gate oxide layer 4 and a word line 33 in a similar manner as discussed in connection to FIG. 2A. In FIG. 3B, a silicon nitride layer 630a is shown deposited by the low pressure chemical vapor deposition. The silicon nitride layer 630a is thermally oxidized to form a silicon oxide layer 630b. Next the silicon nitride layer 630a and the silicon oxide layer 630b are etched away in predetermined patterns to patternize into desired silicon nitride layer 63a and silicon oxide layer 63b, which together form a high resistance layer of double-layer structure.

Figure 2G:
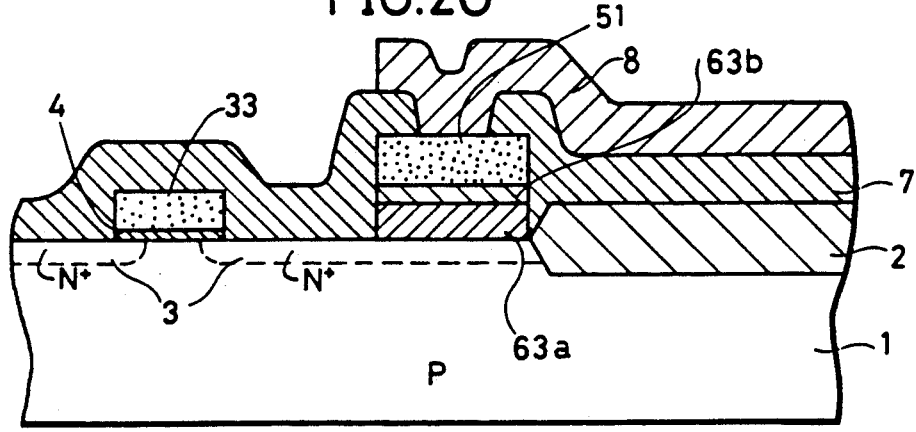
Figure 3C:
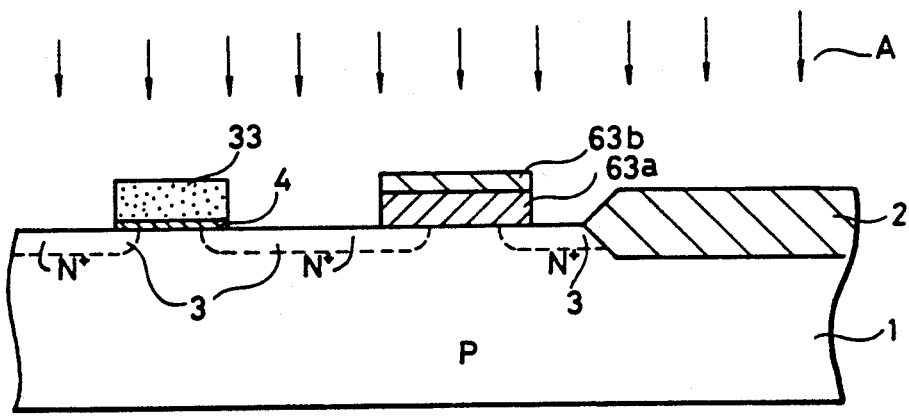
Figure 3D:
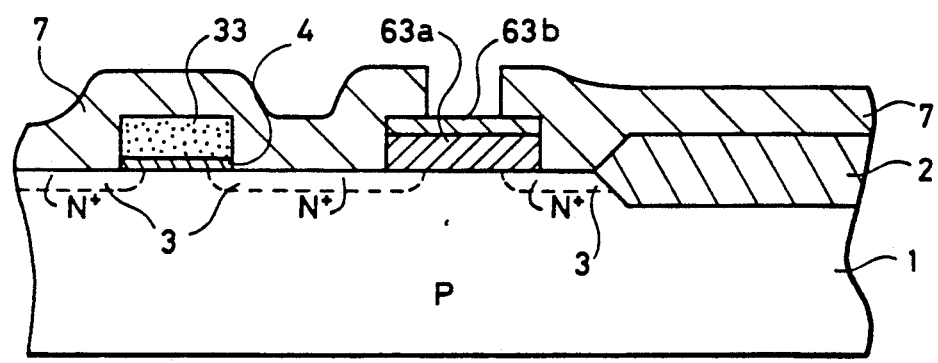

Referring to FIGS. 3C, using the combined structure of silicon nitride layer 63a and silicon oxide layer 63b, and the word line 33 as the masks, arsenic ions and phosphorus ions are implanted into the P-type silicon substrate 1 to create and N+ diffusion region 3. Thereafter, as shown in FIGS. 3D and 3E, an insulating layer 7 and an aluminum interconnection 8 are formed on the silicon oxide layer 63b following similar procedures employed in the steps of FIGS. 2F and 2G.

Figure 3E:
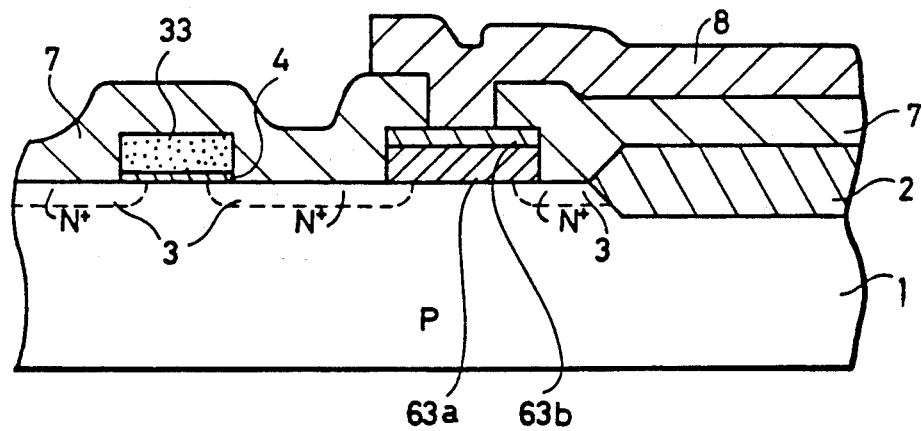

The high resistance layer thus formed of the silicon nitride layer 63a and the silicon oxide layer 63b as shown in FIG. 3E is not positioned over the electric N+ diffusion region 3. However, it produces results similar to those obtained by the high resistance layer shown in FIG. 2G.

Figure 4:
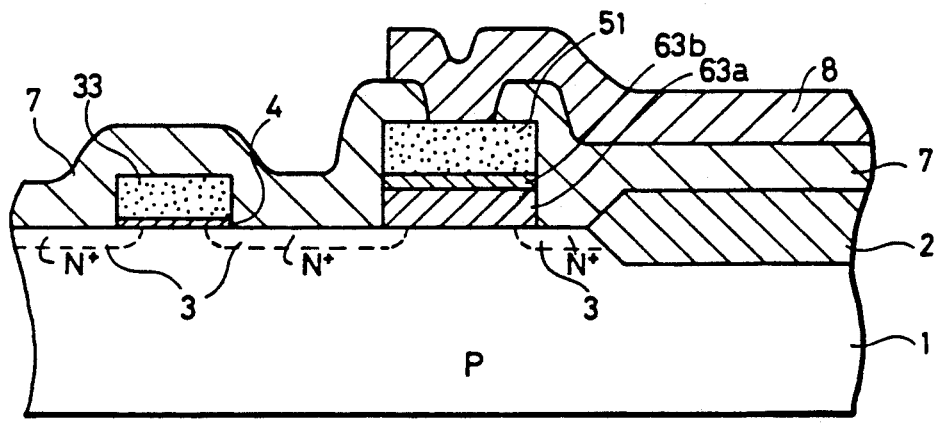
FIGS. 4-6 are cross-sectional views of SRAMs having a high resistance layer according to other embodiments of the invention.

In the arrangement of FIG. 3E, the silicon oxide layer 63b is in direct contact with the aluminum interconnection 8. However, as best seen in FIG. 4, a low resistance polysilicon layer 51 may be formed, to the same advantage, on the oxide layer 63b to which the aluminum interconnection 8 is connected.

Figure 5:
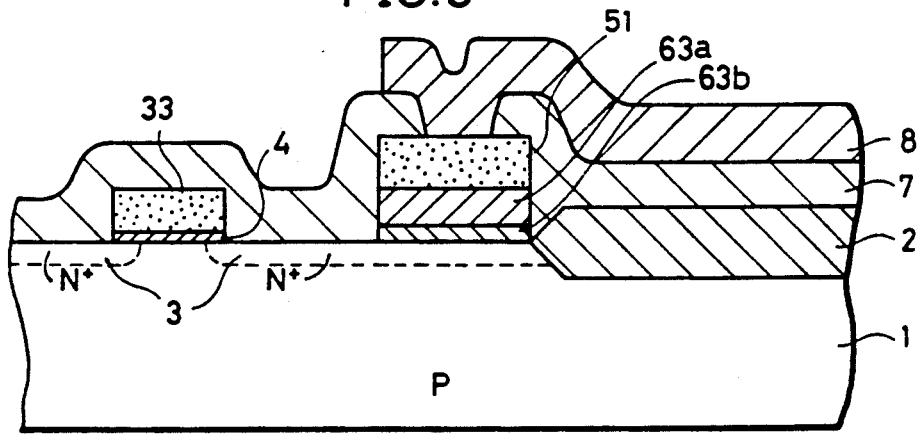

In the arrangement of the high resistance layer shown in FIGS. 2G and 3E, the silicon oxide layer 63b overlies the silicon nitride layer 63a. However, an inverted double-layer arrangement of FIG. 5 where the silicon nitride layer 63a overlies the silicon oxide layer 63b may be employed to substantially the same advantage.

Figure 6:
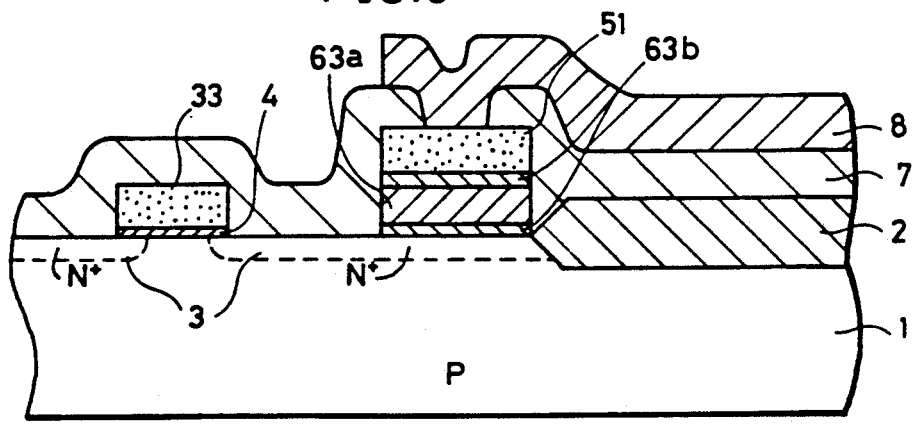

In the foregoing embodiments, the high resistance layer has been described having a double-layer structure which comprises the silicon nitride layer and the silicon oxide layer. However, the high resistance layer may be formed of three layers as shown in FIG. 6: a silicon oxide layer 63b; a silicon nitride layer 63a; and a silicon oxide layer 63b. In short, the high resistance layer according to the invention should have at least one oxide layer and one nitride layer which are stacked together regardless of their relative arrangement and combination.

Figure 7A:
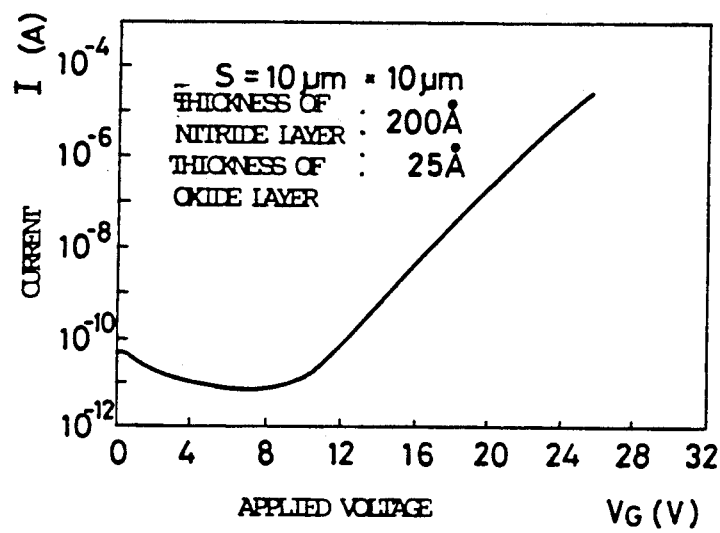
FIGS. 7A and 7B are graphic representation showing performance characteristics of the high resistance layer in the SRAM according to the invention.

Referring to FIG. 7A, there is illustrated voltage-current characteristics of the high resistance layer comprising the silicon nitride layer and the silicon oxide layer according to the invention. The high resistance layer has a current carrying area of 10 $\mu$m $\times$ 10 $\mu$m. The nitride layer in the high resistance structure has a thickness of 200 Å, while the oxide layer has a thickness of 25 Å. As can be seen in the figure, at the applied voltage $V_G$ (or the supply voltage) of 5 V, the current flows through the high resistance layer in the order of $10^{-11}$A. The resistance value of the double-layer structure is dependent on the thickness of the oxide layer over the nitride layer.

Figure 7B:
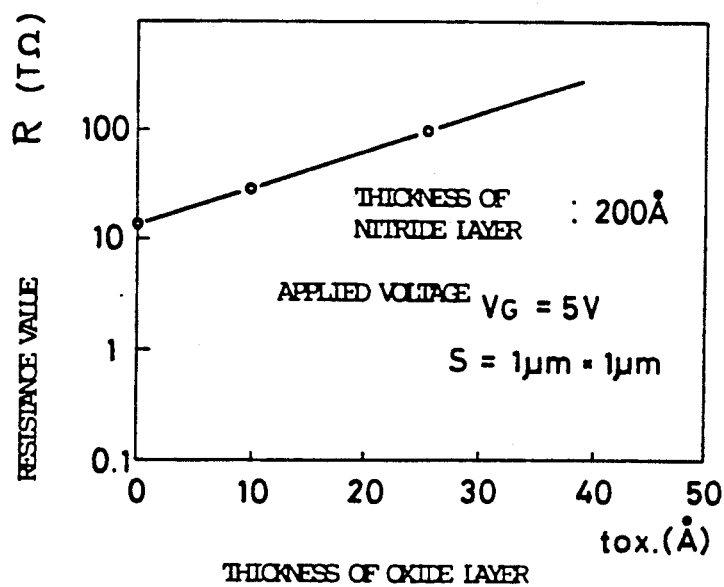

FIG. 7B illustrates how the resistance of the double-layer structure depends on the thickness of the oxide layer. The double-layer resistance structure has a current carrying area of 1 $\mu$m $\times$ 1 $\mu$m. The nitride layer has a thickness of 200 Å. The voltage $V_G$ applied to the layer structure is 5 V. It is apparent from FIG. 7B that a stable high resistance is obtained by controlling the thickness of the oxide layer which overlies the nitride layer. For example, assuming that the layered high resistance structure has a current carrying area of 1 $\mu$m$^2$, the nitride layer has a thickness of 200 Å, and the oxide layer has a thickness of 10 Å, the high resistance structure exhibits the resistance value of 50 T$\Omega$ at the applied voltage of 5 V.

When the double-layer high resistance structure of the invention is incorporated into the SRAM, the high resistance structure is able to pass electric current greater than the leakage current at the P-N junction of the driver transistors. Thus, there is a maximum allowable resistance value for the double-layer high resistance structure. For example, when 10,000 transistors now available in the market are connected in parallel, the total leakage current amounts to some $10^{-9}$A at the applied voltage of 5 V. The leakage current for the individual transistor is around $10^{-13}$A. This suggests that the high resistance structure provided in each memory cell of the SRAM should be able to carry an electric current of more than $10^{-13}$A. It is estimated that the maximum allowable resistance value for the one high resistance structure is $5\times 10^{13}$, or 50 T$\Omega$ (at the applied voltage of 5 V). The minimum allowable resistance value for the one high resistance structure is restricted by the standby current of semiconductor device. For example, the standby current for the individual device is about $10^{-6}$A at the applied voltage of 3 V. It is estimated that the minimum allowable resistance value for the one high resistance structure is about $1\times 10^{13}\Omega$, or 1T$\Omega$ (in 4M bit SRAM). Therefore, the range of desired resistance value is from $1\times 10^{13}$ to $5\times 10^{13}\Omega$. As is apparent from FIG. 7B, in order to realize this resistance value, the double-layer high resistance structure should have an area of 1 $\mu$m$^2$ and comprises a nitride layer of 200 Å thick and an oxide layer less than about 15 Å thick.

Figure 8A:
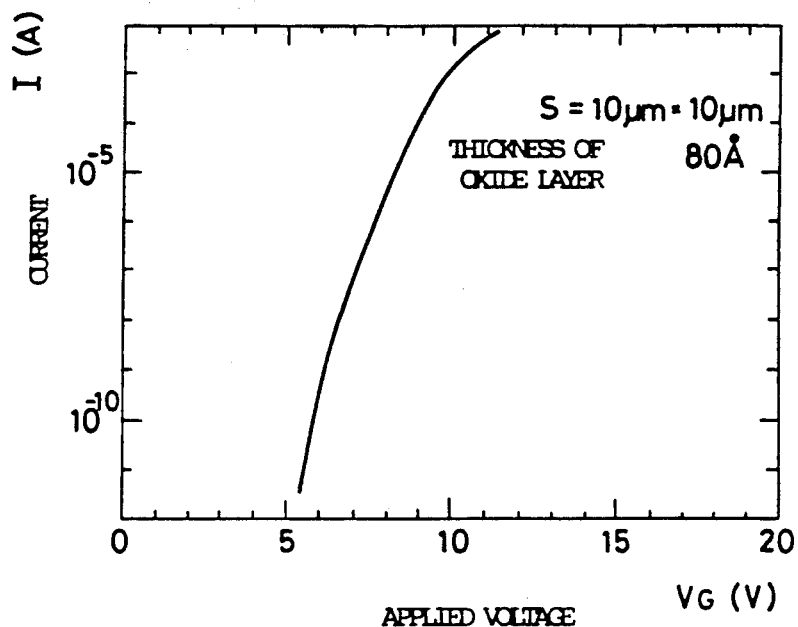
FIGS. 8A and 8B are graphic representations, for the purpose of comparison, showing performance characteristics of a single oxide layer structure.

For the purpose of comparison, reference is made to a resistance structure formed of a single silicon oxide layer. FIG. 8A shows a current-voltage characteristics of an oxide layer having a thickness of 80 Å. It is noted that the single oxide layer has a current carrying area of 10 $\mu$m $\times$ 10 $\mu$m. As shown, no appreciable current flows through the oxide layer at the applied voltage of 2-3 V, only the Fowler-Nordheim tunnel current flows at this voltage.

Figure 8B:
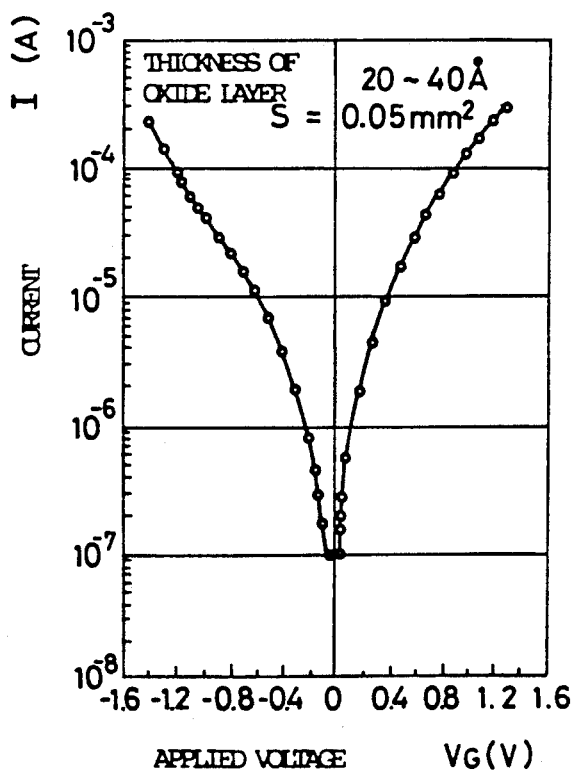

In FIG. 8B, current-to-voltage characteristics for the oxide layer having a thickness between 20-40 Å are shown. The oxide layer has a current area of 0.05 mm$^2$. As can be seen in FIG. 8B, a large amount of current flows through the oxide layer at the applied voltage of 2-3 V. With the current carrying area 10 $\mu$m $\times$ 10 $\mu$m, the current flows in quantities one-to-five-hundred as shown in FIG. 8B. Still they are quite large. The current flow plotted in FIG. 8B is direct tunnel current.

The single oxide layer structure exhibits excessively high resistance over a thickness of 50 Å (FIG. 8A), and at a thickness less than 50 Å, it permits too much current flow to serve as a high resistance layer (FIG. 8B).

Figure 9:
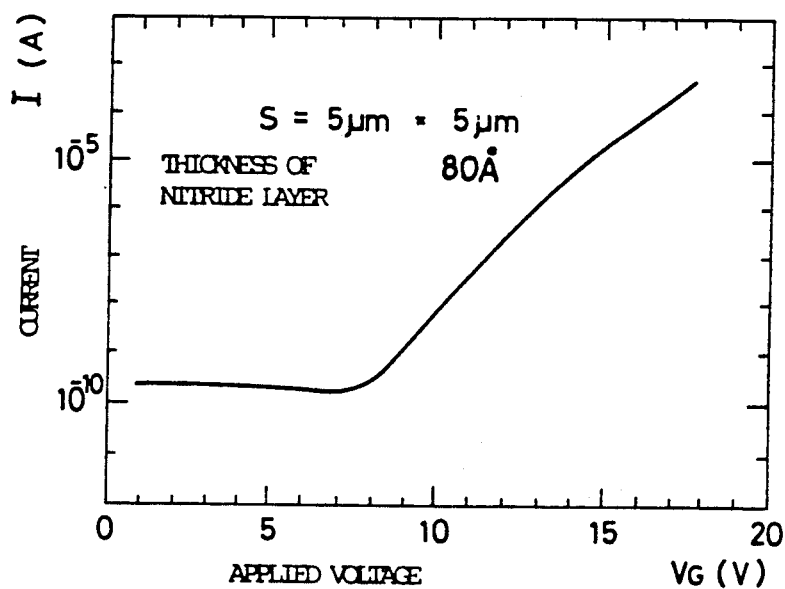
FIG. 9 is a graphic representation, for the purpose of comparison, showing performance characteristic of a single nitride layer structure.
Figure 11B:
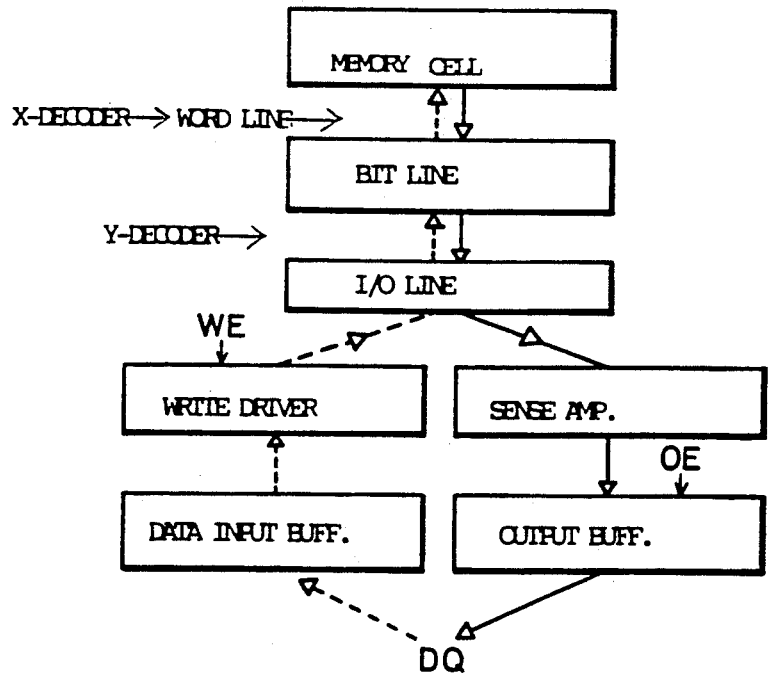
FIGS. 11B is a flow diagram showing the flow of data in the SRAM of FIG. 11A.

For the purpose of comparison, reference is made to a single silicon nitride layer structure. FIG. 9 shows current-to-voltage characteristics of the nitride layer having a thickness of 80 Å. The current flowing area for the nitride layer is 5 $\mu$m $\times$ 5 $\mu$m. As can be seen in this figure, more than $10^{-10}$ A of current flows through the nitride layer at the applied voltage $V_G$ of about 5 V. This indicates that the leakage current for the single nitride layer is greater than that of the transistor. For the current passing area of 10 $\mu$m $\times$ 10 $\mu$m, the current flows four times as much as those shown in FIG. 9. Thus, when compared to the current flow through the stacked nitride-oxide layer structure of the invention shown in FIG. 7A, the single nitride layer structure permits a higher current flow. The use of the single nitride layer in the memory cell will result in an increased power consumption. The resistance structure formed only of the silicon nitride layer can not retain in reliable performance for a prolong period of time due to the presence of many traps and interface energy levels. In other words, the resistance value changes with time.

As discussed hereinabove, when attempted to use the single silicon oxide layer or single nitride layer as the high resistance structure, it is difficult to control the resistance value by adjusting the thickness of the layer. It is also difficult to design a high resistance structure which allows a current flow therethrough larger than the leakage current in the transistor but small enough to reduce power dissipation to a possible minimum.

Figure 10A:
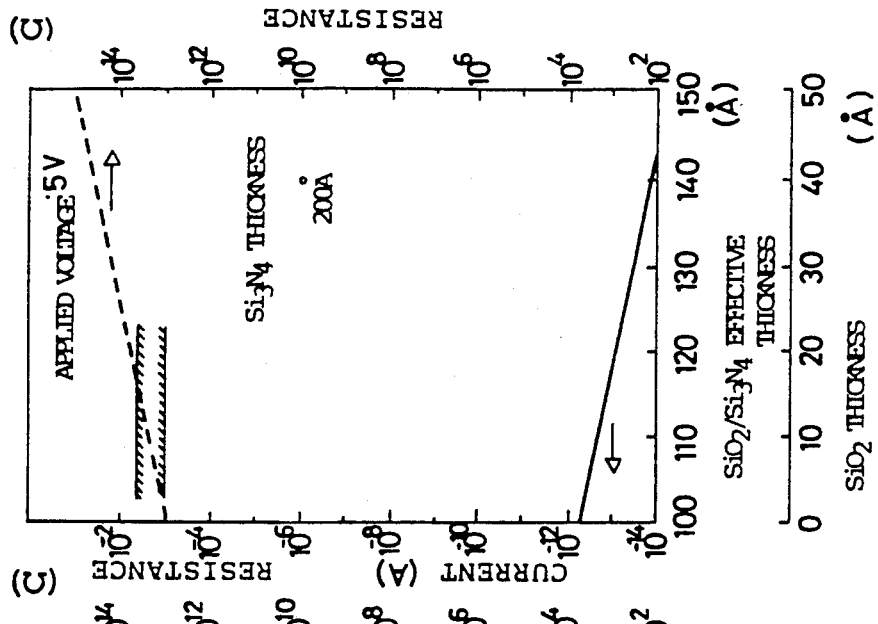
FIGS. 10A, 10B and 10C are graphic representations showing the relations between the current/resistance and $SiO_2$ thickness, $Si_3N_4$ thickness or $SiO_2/Si_3N_4$ effective thickness, respectively.
Figure 10B:
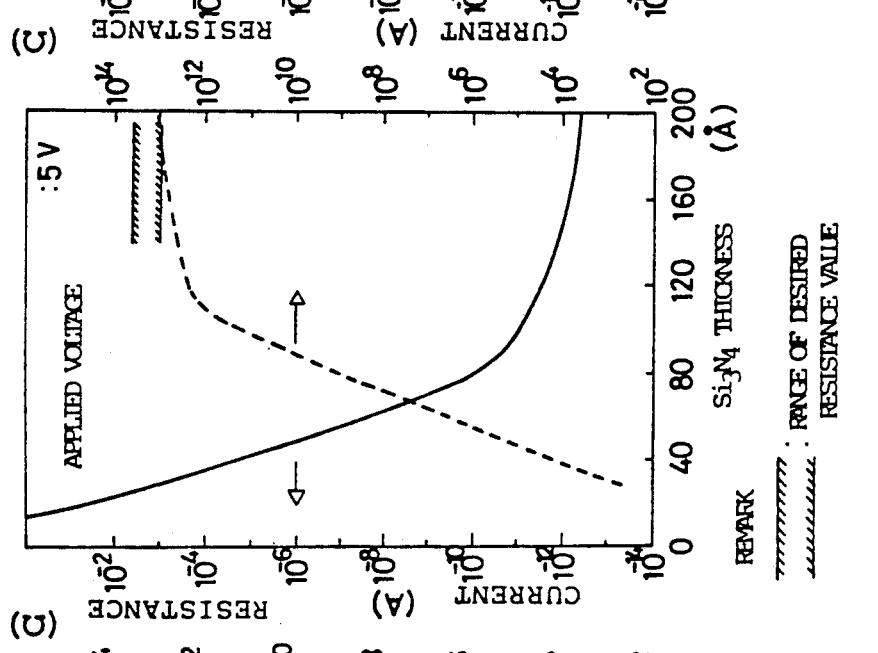
Figure 10C:
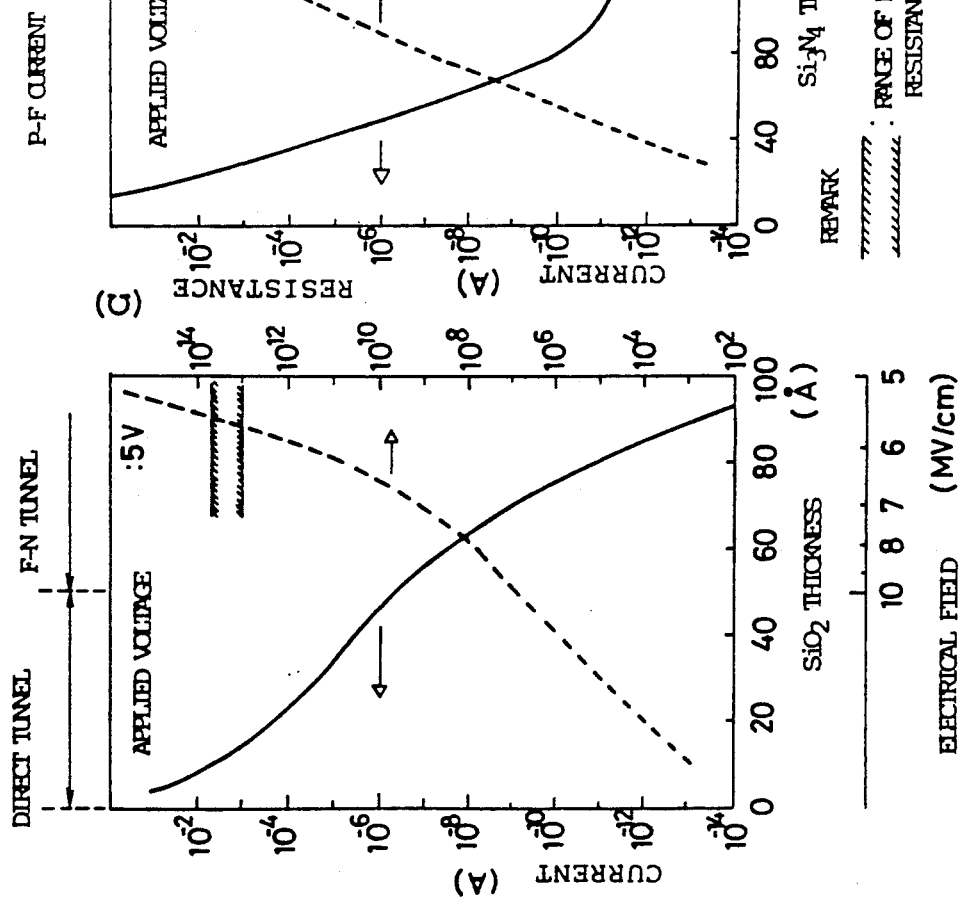
Figure 11A:
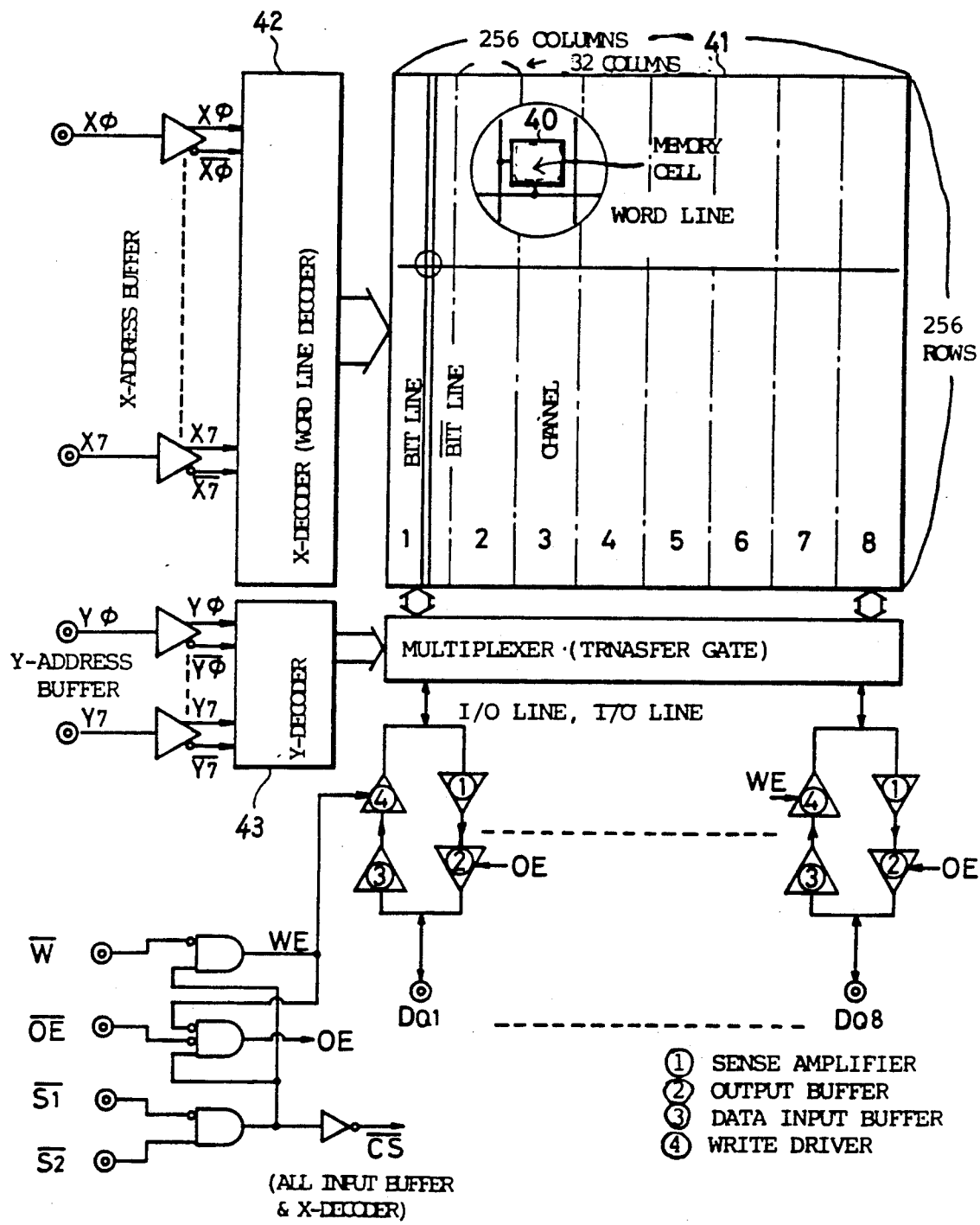
FIG. 11A is a block diagram showing an overall arrangement of a conventional SRAM.
Figure 13A:
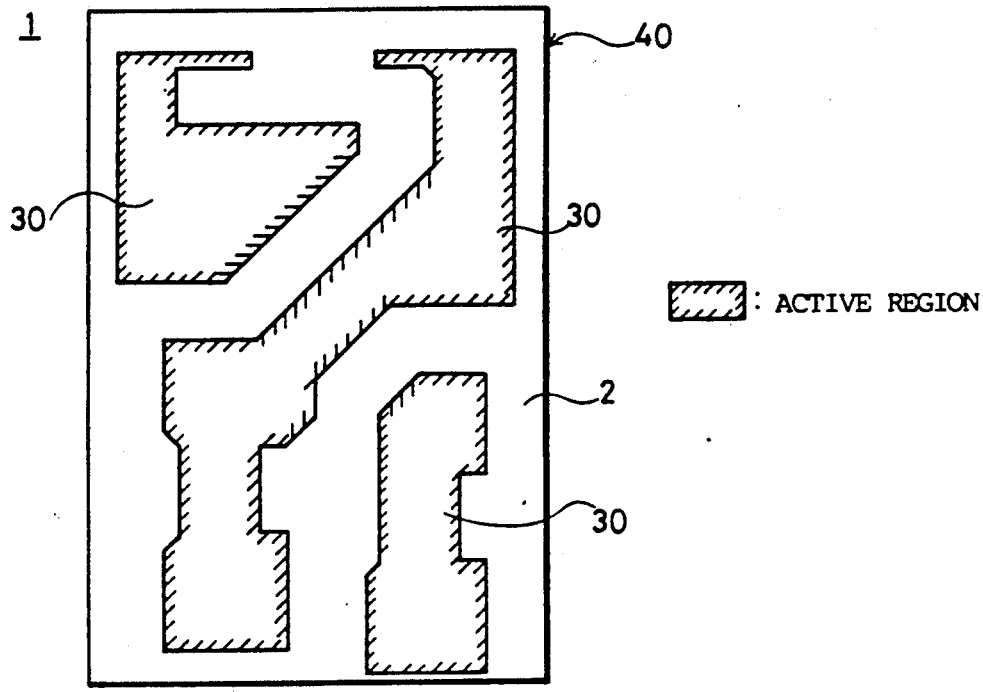
FIGS. 13A-13E are partial plan views showing pattern layouts for one memory cell in the conventional high load resistance type SRAM at successive stages of manufacture.
Figure 13B:
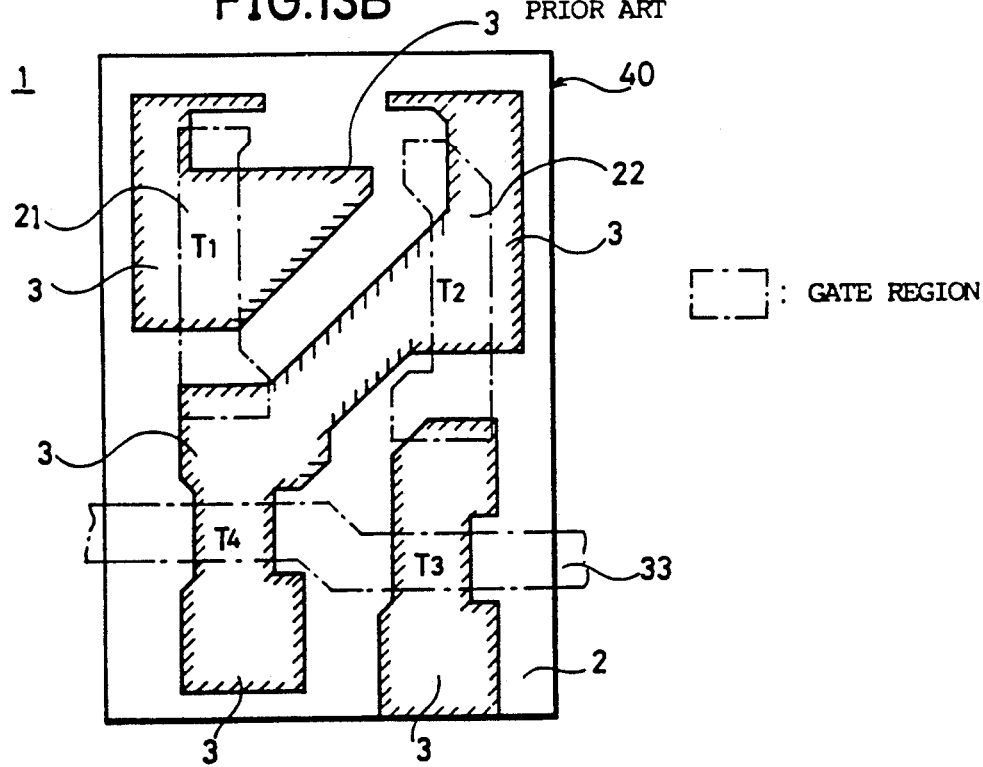
Figure 13C:
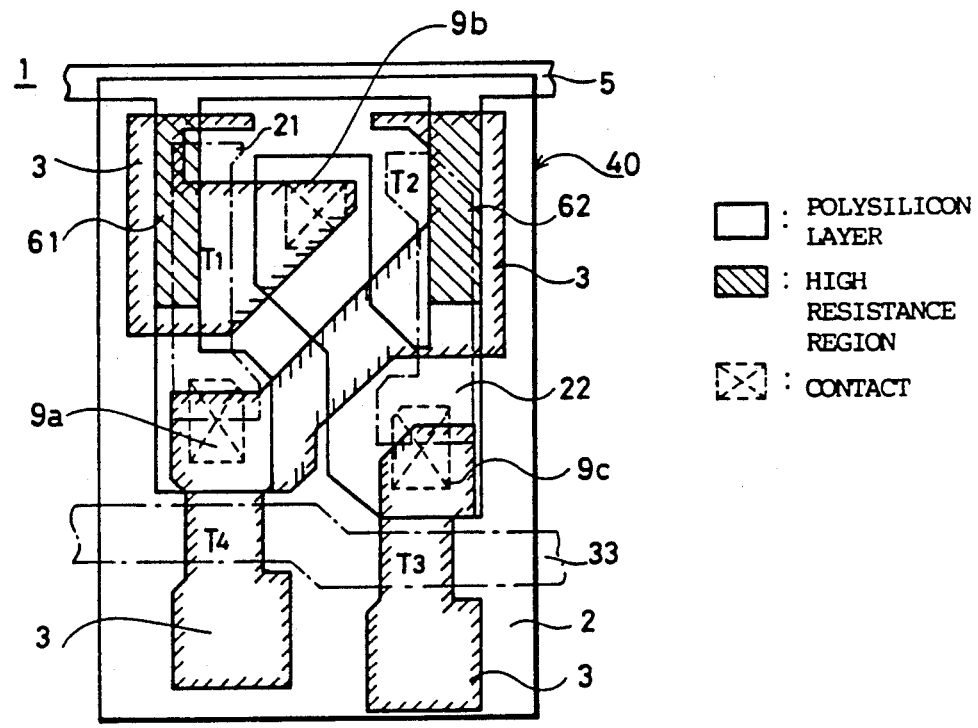
Figure 13D:
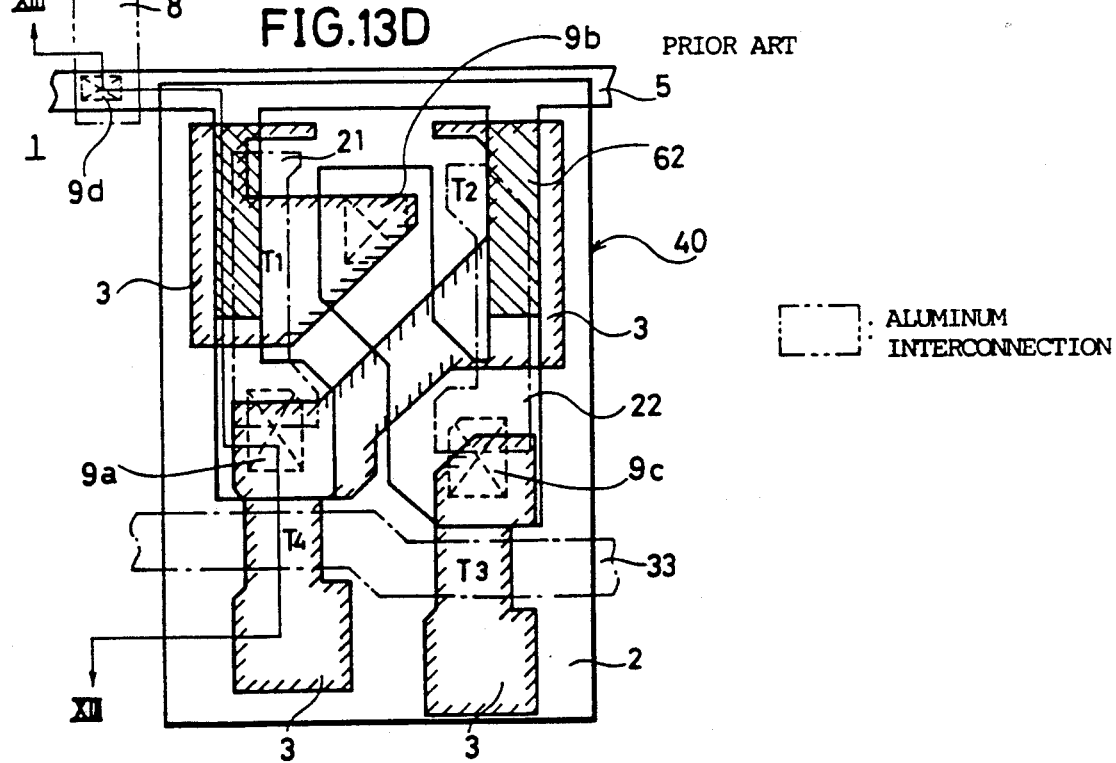
Figure 13E:
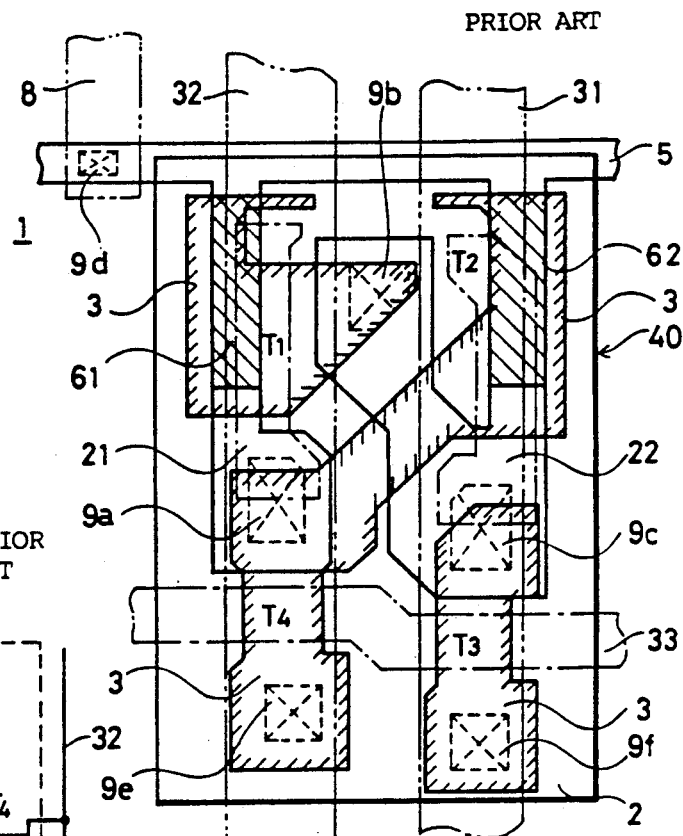
Figure 12:
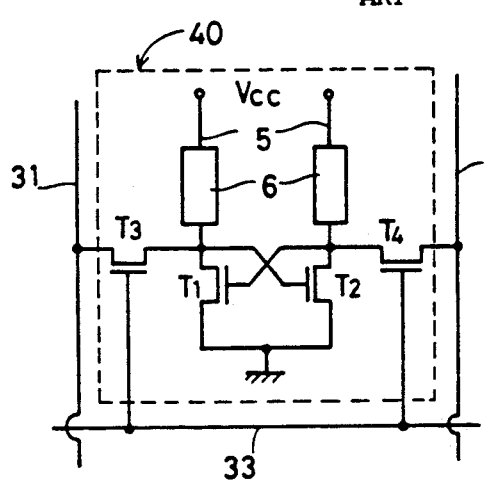
FIG. 12 is an equivalent circuit of one memory cell in the high load resistance type SRAM.
Figure 14:
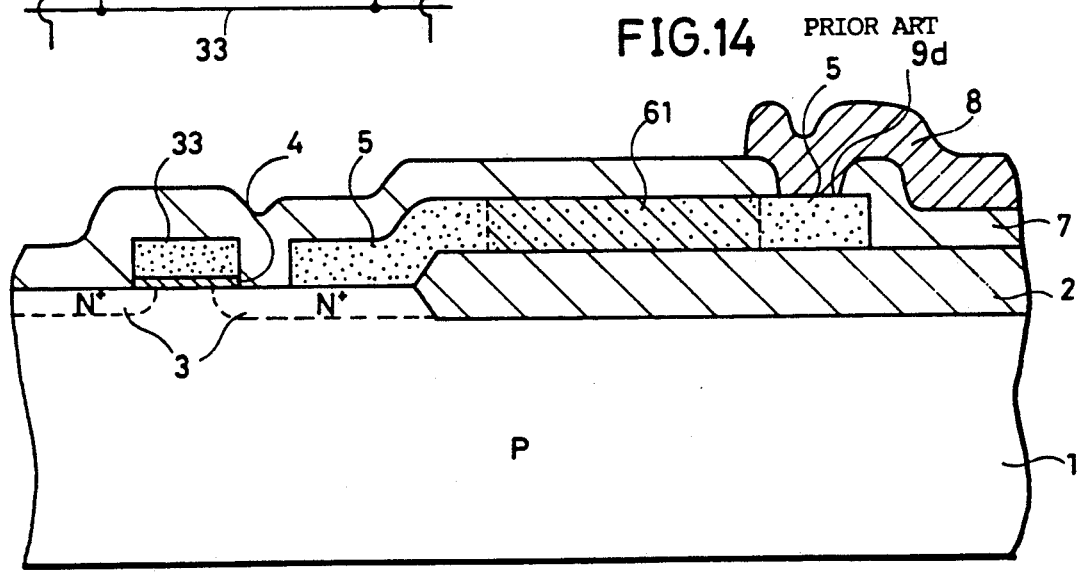
FIG. 14 is a cross sectional view taken along the line XIII—XIII of FIG. 13D.
Figure 15:
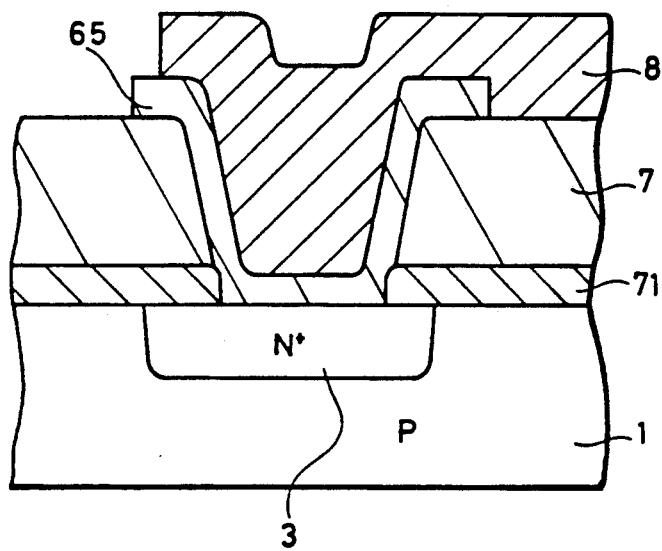
FIG. 15 is a partial cross sectional view of a semiconductor device having high resistance layer.

FIGS. 10A, 10B and 10C show the characteristics of conduction through a single $SiO_2$, a single $Si_3N_4$ layer and a $SiO_2/Si_3N_4$ double-layer respectively. Referring to FIG. 10A, it is difficult to control the resistance value of $SiO_2$ layer within the range of desired resistance value ($1 \times 10^{13}$ to $5 \times 10^{13} \Omega$) by adjusting the thickness of the layer. It is also difficult to attain the desired high resistance value by using $Si_3N_4$ layer as shown in FIG. 10B. As shown in FIG. 10C, the resistance value of $SiO_2/Si_3N_4$ double-layer can be easily controlled within the range of desired resistance value by adjusting $SiO_2$ thickness based on $Si_3N_4$ thickness of 200 Å. "$SiO_2/Si_3N_4$ effective thickness" shows the thickness converted into the thickness of $SiO_2$ layer having the same capacitance as that of $SiO_2/Si_3N_4$ double-layer.

As can be understood from the foregoing description, the high resistance structure of the combined oxide-nitride layer makes it possible to adjust each resistance at a desired value by controlling the thickness of the layer. Current path in the high resistance layer of the invention is formed to extend vertically with respect to the substrate instead of extending horizontally, which contributes to making the semiconductor device smaller in size. In addition, the nitride and oxide layer for the double layered high resistance structure are readily formed of silicon compound and do not contaminate the substrate. In short, according to the invention, there is provided a semiconductor device having a stable high resistance structure which produces a desired high resistance in a small area and whose high resistance is not impaired by diffusion and penetration of external impurities thereinto. A high density, high load resistance type SRAM is one advantageous application of the invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate of a first conductivity type, having a major surface;
   a semiconductor region of a second conductivity type formed on the major surface of said semiconductor substrate;
   a conductive layer formed over said semiconductor region; and
   a high resistance layer comprising an oxide layer and a nitride layer which are stacked together and disposed between said conductive layer and said semiconductor region,
   wherein said oxide layer and said nitride layer have respective thicknesses selected to provide an electrical resistance for the high resistance layer in the range $1 \times 10^{13}$ to $5 \times 10^{13} \Omega$, and wherein
   said high resistance layer comprises a double-layer structure with said nitride layer formed adjacent to said semiconductor substrate and said oxide layer formed adjacent to said conductive layer.

2. A semiconductor device comprising:
   a semiconductor substrate of a first conductivity type, having a major surface;
   a semiconductor region of a second conductivity type formed on the major surface of said semiconductor substrate;
   a conductive layer formed over said semiconductor region; and
   a high resistance layer comprising a first oxide layer and a nitride layer which are stacked together and disposed between said conductive layer and said semiconductor region,
   wherein said first oxide layer and said nitride layer have respective thicknesses selected to provide an electrical resistance for the high resistance layer in the range $1 \times 10^{13}$ to $5 \times 10^{13} \Omega$, and wherein
   said high resistance layer comprises a structure including an additional oxide layer with said nitride layer sandwiched between said first oxide layer and said additional oxide layer.

3. A semiconductor device comprising:
   a semiconductor substrate of a first conductivity type, having a major surface;
   a semiconductor region of a second conductivity type formed on the major surface of said semiconductor substrate;
   a conductive layer formed over said semiconductor region; and
   a high resistance layer comprising an oxide layer and a nitride layer which are stacked together and disposed between said conductive layer and said semiconductor region,
   wherein said oxide layer and said nitride layer have respective thicknesses selected to provide an electrical resistance for the high resistance layer in the range $1 \times 10^{13}$ to $5 \times 10^{13} \Omega$, and
   a semiconductor element connected to said high resistance layer on the major surface of said semiconductor substrate,
   wherein said semiconductor element comprises said semiconductor region,
   and wherein said semiconductor region comprises a part of a field effect device.

4. A semiconductor device according to claim 3, wherein:
   said field effect device has an insulated gate electrode and first and second electrodes provided spaced away from each other on the major surface of said semiconductor substrate below said insulated gate, and said semiconductor region forms said first and second electrodes.

5. A semiconductor device according to claim 4 wherein:
   said high resistance layer and said field effect device comprise data storage means of flip-flop type.

6. A semiconductor device according to claim 5, further comprising:
   a static random access memory.

7. A static random access memory (SRAM, comprising:
- a semiconductor substrate of a first conductivity type and having a major surface;
- word lines and bit line pairs intersecting each other on the major surface of said substrate, memory cells at intersections of said word lines and said bit lines;
- each of said cells comprising a pair of field effect transistors (T1, T2) formed on said substrate and having gate electrodes and drain regions cross-coupled to each other, with said drain regions thereof each connected through a load resistor to a voltage source terminal, to form a flip-flop, and a pair of access transistors controlled by a word line for interconnecting said cell with a bit line pair;
- wherein said load resistor comprises an oxide layer and a nitride layer stacked together and having respective thickness selected to provide a composite resistance of said resistor within the range of $1 \times 10^{13}$ and $5 \times 10^{13}$ ohms.

8. A semiconductor device, comprising:
- a semiconductor substrate of a first conductivity type, having a major surface;
- a semiconductor region of a second conductivity type formed on the major surface of said semiconductor substrate;
- a conductive layer formed over said semiconductor region; and
- a high resistance layer comprising a thermal oxide layer and a nitride layer which are stacked together and disposed between said conductive layer and said semiconductor region,
- wherein said high resistance layer comprises a double-layer structure with said nitride layer being first formed to be closer to said semiconductor substrate than said thermal oxide layer, said thermal oxide layer being formed by thermal oxidation on said nitride layer such that said thermal oxide layer is located adjacent to said conductive layer, and
- said high resistance double-layer structure has a thickness controlled to provide a resistance value less than $5 \times 10^{13} \Omega$.

9. A semiconductor device according to claim 8, wherein:
said high resistance layer comprises a structure including an additional oxide layer with said nitride layer sandwiched between said thermal oxide layer and said additional oxide layer.

10. A semiconductor device according to claim 8, wherein: said thermal oxide layer comprises a silicon oxide layer.

11. A semiconductor device according to claim 8, wherein: said nitride layer comprises a silicon nitride layer.

12. A semiconductor device according to claim 8, wherein:
said conductive layer comprises a polysilicon layer formed on said high resistance layer.

13. A semiconductor device according to claim 8, further comprising:
a semiconductor element connected to said high resistance layer on the major surface of said semiconductor substrate.

14. A semiconductor device according to claim 13, wherein:
said semiconductor element comprises said semiconductor region.

15. A semiconductor device according to claim 14, wherein:
said semiconductor region comprises a part of a field effect device.

16. A semiconductor device according to claim 15, wherein:
said field effect device has an insulated gate electrode and first and second electrodes provided spaced away from each other on the major surface of said semiconductor substrate below said insulated gate, and said semiconductor region forms said first and second electrodes.

17. A semiconductor device according to claim 16, wherein:
said high resistance layer and said field effect device comprise data storage means of flip-flop type.

18. A semiconductor device according to claim 17, further comprising:
a static random access memory.

* * * * *